United States Patent

Arney et al.

Patent Number: 5,287,082
Date of Patent: Feb. 15, 1994

[54] SUBMICRON ISOLATED, RELEASED RESISTOR STRUCTURE

[75] Inventors: Susanne C. Arney; Noel C. MacDonald; Jun J. Yao, all of Ithaca, N.Y.

[73] Assignee: Cornell Research Foundation, Inc., Ithaca, N.Y.

[21] Appl. No.: 906,877

[22] Filed: Jul. 2, 1992

[51] Int. Cl.⁵ ............................................. H01C 1/012
[52] U.S. Cl. ...................................... 338/307; 338/64; 338/314
[58] Field of Search .................... 338/307, 64, 314; 257/514, 517, 256, 268, 552, 536; 437/249

[56] References Cited

U.S. PATENT DOCUMENTS

| | | |
|---|---|---|
| 4,437,226 | 3/1984 | Soclof . |
| 4,648,173 | 3/1987 | Malaviya ........................ 257/517 X |
| 4,668,865 | 5/1987 | Gimzewski et al. . |
| 4,670,092 | 6/1987 | Motamedi . |
| 4,685,198 | 8/1987 | Kawakita et al. . |
| 4,764,799 | 8/1988 | Malaviya ............................. 257/514 |
| 4,776,924 | 10/1988 | Delapierre . |
| 4,845,048 | 7/1989 | Tamaki et al. . |
| 5,043,577 | 8/1991 | Pohl et al. . |

OTHER PUBLICATIONS

"Formation of submicron silicon-on-insulator structures by lateral oxidation of substrate-silicon islands" Arney and MacDonald, J. Vac. Sci. Technol. B 6(1) Jan./Feb. 1988 pp. 341-345.

"TEM Characterization of defect configurations in Submicron SOI Structures" N. D. Theodore et al; Preprint: Proc. 6th Int. Conf. on Microscopy of Semiconducting Materials, Oxford, UK, Apr. 10-13, 1989.

Primary Examiner—Marvin M. Lateef
Attorney, Agent, or Firm—Jones, Tullar & Cooper

[57] ABSTRACT

A submicron resistor having negligible parasitic capacitance includes an isolated released beam carried on a single crystal silicon wafer. The resistor is fabricated by defining a resistor region in the substrate, doping the region to produce the desired resistivity, and etching around the region to produce a resistive island. The island is then isolated from the substrate by oxidation, and is released by removing the oxide to produce an isolated, released resistor beam.

18 Claims, 4 Drawing Sheets

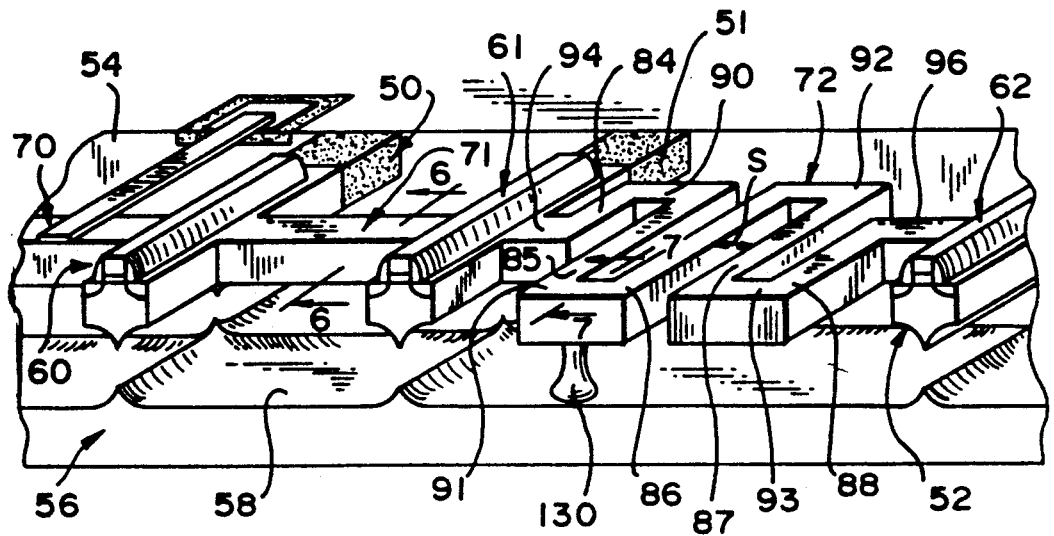
FIG. 6
FIG. 3
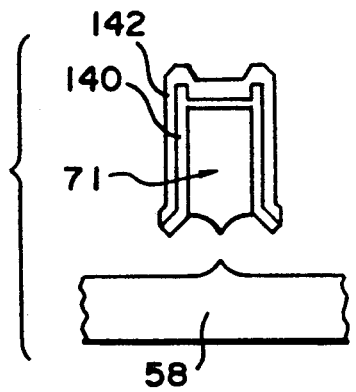
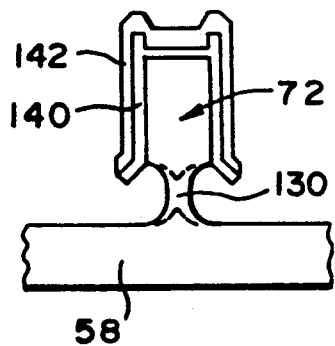
FIG. 7
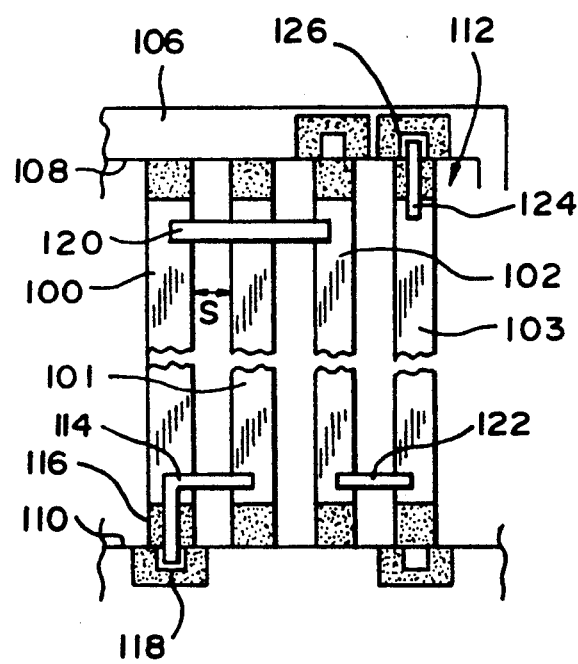
FIG. 5

SUBMICRON ISOLATED, RELEASED RESISTOR STRUCTURE

This invention was made with Government support under Contract No. DABT-63-92-C0019, awarded by DARPA. The Government has certain rights in the invention.

BACKGROUND OF THE INVENTION

The present invention relates, in general, to components for integrated circuits and the like and, more particularly, to submicron, isolated components having high resistance and low parasitic capacitance for the interconnection of circuit elements having submicron-range dimensions.

One of the limiting factors in the performance of integrated circuits, thin film circuits, or other closely-spaced circuit arrays is the existence of parasitic capacitance between adjacent circuit elements or between such elements and the substrate on which they are located. Such capacitance often inserts unwanted impedances into the connections between adjacent circuit elements to limit the speed of operation and the sensitivity of a circuit, as by changing the time constant of a resistor network. Parasitic capacitance may, for example, limit the ability of a circuit to measure low current values, may adversely affect the response time of a circuit, and in general has adverse effects on overall circuit performance. Such parasitic capacitances often appear in conjunction with resistor networks or single resistors interconnecting circuit components, or may appear between conductors and adjacent structures, and great effort is expended in conventional circuit design to minimize the effects of such parasitics.

As circuit components are reduced in size due to the high demand for increased density, higher operating speeds, and lower costs, the adverse and limiting effects of parasitic capacitance becomes a larger and larger factor, and there is a significant need for improved techniques for reducing or eliminating such effects.

One approach has been the use of thin film technology for the fabrication of circuit elements such as connectors, resistors and the like, but such devices have not satisfactorily solved the problem, since materials such as polysilicon exhibit grain boundary effects and noise.

SUMMARY OF THE INVENTION

It is an object of the present invention to provide a submicron circuit structure which is substantially free of parasitic capacitance.

More particularly, it is an object of the present invention to provide submicron resistor circuit components having a structure which overcome the problem of parasitic capacitance.

Another object of the present invention is the provision of microstructures utilizing submicron elements such as resistors for the interconnection of circuit devices, wherein parasitic capacitance is substantially eliminated, thereby improving the performance of submicron circuits and permitting improved miniaturization.

An additional object of the invention is the provision of a submicron resistor element which is electrically isolated and released from adjacent structures, wherein the isolation is provided in part by a shield surrounding the resistor.

A still further object of the invention is the provision of submicron isolated and released resistor elements fabricated from single crystal silicon to provide high quality resistors with low noise.

Briefly, the present invention relates to submicron circuit components such as resistors for use in microstructure circuitry, wherein such components are free of parasitic capacitance. Such submicron circuit components are usable, in accordance with the invention, to interconnect integrated circuit elements such as transistors and other active devices, and may be fabricated integrally with such circuit devices to provide high quality, high density circuits with significantly reduced parasitic capacitance. In particular, and in accordance with the preferred form of the present invention, circuit components such as resistors are fabricated to be integral with microstructure devices, and accordingly are fabricated from the same material, thereby facilitating the formation of submicron circuits while at the same time improving their performance. The circuit components consist of isolated beams fabricated from the material of the substrate on which they are carried and released therefrom so that the beams are surrounded by air or by a vacuum.

More particularly, isolated beams are fabricated from a substrate consisting of a single crystal material such as single crystal silicon, which may include epitaxial silicon or silicon-germanium overlayers, with the beams having cross sectional dimensions in the submicron range; for example, such beams may have cross sectional dimensions of about 0.1 micron. The isolated beams are released from the substrate so as to be spaced therefrom, whereby the beam is surrounded by air or other medium having a very low dielectric constant and the capacitance between the released element and the substrate is made negligible. The spacing between the beam and the adjacent substrate may be in the range of about 0.5 to 5.0 micrometers to substantially eliminate parasitic capacitance between them. The beam may be similarly spaced from adjacent circuit elements, although smaller spacing can be utilized when there is no significant potential voltage between adjacent elements.

In the fabrication of the submicron circuit component of the invention, and in particular the formation of a resistor, the component is first defined in the substrate and then is isolated therefrom, as by suitable etching and oxidation steps. The beam is suitably doped either after it has been defined or after it has been isolated, to provide the desired resistivity for the beam material. The resistance of the submicron element so defined is inversely proportional to the cross sectional area of the element after it has been isolated and released, and is proportional to its length, in accordance with the following equation:

$$R = \rho \frac{1}{tw} \qquad \text{(Eq. 1)}$$

where $\rho$ is the resistivity of the material in ohm-centimeters ($\Omega$-cm), t is its thickness in cm, w is its width in cm, and 1 is its length in cm. The resistivity is determined by the degree of doping of the material and, where the substrate material from which the beam is formed is single crystal silicon, the resistivity can be easily made to vary between about 0.001 and 10.0 $\Omega$-cm and, with more difficulty, can be increased to as much as 1,000 $\Omega$-cm.

Since the resistance of the beam varies with its resistivity and length, and inversely with its cross sectional area, the resistance of the element can be selected with a great deal of accuracy. The length of the component is easily controlled during fabrication of the beam. This can be done, for example, by forming the resistance as a plurality of cantilevered beams connected by suitable conductors, or by fabricating an elongated beam having a folded, or sinuous shape. Any desired length can be attained, and thus any desired resistance, consistent with the available space. Elongated beams can be strengthened by coating them with an oxide or a nitride dielectric material which serves as an insulating coating without affecting the resistance. Conductive coating can also be provided to shield the resistor element, further reducing parasitic capacitance.

If necessary, the beam can be supported by oxide pedestals or opposed tips, thereby securing the beams to the substrate to prevent them from bowing or otherwise moving with respect to the substrate and possibly increasing the parasitic capacitance inadvertently. Large resistances can be fabricated in this manner, thereby allowing high density fabrication of integrated circuits and permitting the fabrication of very small, closely spaced circuit elements with low RC constants to permit high operational speeds, thereby removing many of the limitations experienced in the prior art in miniaturization of circuit components and arrays.

BRIEF DESCRIPTION OF THE DRAWINGS

The foregoing, and additional objects, features and advantages of the present invention will become apparent to those of skill in the art from a consideration of the following detailed description of preferred embodiments thereof, taken in conjunction with the accompanying drawings, in which:

FIG. 3 is a perspective, partial diagrammatic view of a plurality of active circuit elements interconnected by the resistor elements of the present invention;

FIG. 5 is a top plan view of a plurality of resisting elements interconnected to form a resistor network;

FIG. 6 is a diagrammatic cross-sectional view of a resistor element taken at 6—6 of FIG. 3;

FIG. 7 is a diagrammatic cross-sectional view of a resistor element taken at 7—7 of FIG. 3;

DETAILED DESCRIPTION OF PREFERRED EMBODIMENTS

Figure 1:
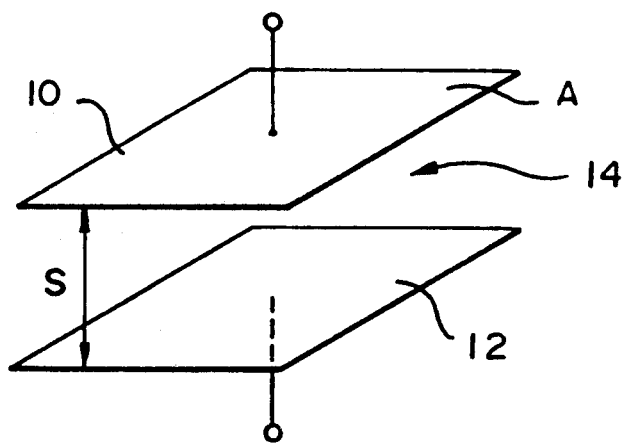
FIG. 1 is a diagrammatic illustration of parasitic capacitance.

As illustrated in FIG. 1, the capacitance C between two adjacent conductive elements, such as conductive plates 10 and 12, is proportional to the area A of the two plates, is inversely proportional to the spacing S between the plates, and is proportional to the dielectric constant of the material in the space 14 between the two plates. This relationship is expressed as follows:

$$K = \frac{\epsilon_r}{\epsilon_0} \qquad \text{(Eq. 2)}$$

$$C = K \epsilon_0 \frac{A}{S} = \epsilon_r \frac{A}{S} \qquad \text{(Eq. 3)}$$

where $\epsilon_r$ is the permittivity of the material in space 14 and $\epsilon_0$ is the permittivity of free space. The dielectric constant K of air equals 1, because the permittivity of air ($\epsilon_r$—air) equals the permittivity of free space ($\epsilon_0 = 8.85 \times 10^{-12}$ F/m). As is well known, this capacitance exists between any two conductive elements and where such capacitance is normally undesired or unexpected, such capacitance may be referred to as a parasitic capacitance. For a thin film circuit element on a substrate, for example, the parasitic capacitance exists between the element and its substrate, and is proportional to the area of the circuit element and to the relative dielectric constant K of the material on which the element is carried. This relative dielectric constant will be greater than 1 since it is not air, and in the case where the material on which the element is carried is an insulating material such as silicon dioxide, the dielectric constant $K_{ox}$ will be in the range of 3.9. The parasitic capacitance changes the RC constant of the resistor, and thus changes the parameters of any circuit in which the resistor is connected.

In accordance with the present invention, a resistor for submicron integrated circuits is provided wherein the resistor is isolated and spaced from any adjacent substrate so that the resistor element is released, i.e., is effectively suspended in free space. As a result, the dielectric constant $K = \epsilon_0$, which is the dielectric constant of air, and the parasitic capacitance is expressed in accordance with Eq. 3 above. Thus, if the plate A is 0.1 micrometers wide and 1.0 micrometers long, if the spacing S is 5.0 micrometers, and if the material 14 has a relative dielectric constant wherein $\epsilon_r/\epsilon_0 = 1$; i.e., is air, then the capacitance between plates 10 and 12 is expressed (in Farads) as follows:

$$C = \epsilon_0 \times \frac{0.1 \, \mu m \times 1.0 \, \mu m}{5.0 \mu} = 0.02 \, \mu m \times \epsilon_0 \, F \qquad \text{(Eq. 4)}$$
$$= 2 \times 10^{-8} \times 8.85 \times 10^{-12} = 1.77 \times 10^{-19} \, F$$

On the other hand, if the space 14 between plates 10 and 12 is filled with a dielectric material such as silicon dioxide, with a permittivity of 3.9, then the capacitance between plates 10 and 12 will be 3.9 times higher than that indicated in Equation 4.

Clearly, therefore, a significant reduction in the parasitic capacitance associated with integrated circuit elements and with thin film devices, and the like, can be obtained by surrounding such elements with air so as to reduce the dielectric constant of the material adjacent the element. This is accomplished, in accordance with the present invention, by fabricating resistive elements in integrated circuits and in related microstructure devices by defining the resistive elements in a substrate material, isolating the elements by etching and oxidation, and releasing the elements from the surrounding substrate by removing the oxide to form, in effect, cantilevered or free beams extending in space above the floor or adjacent the wall of substrate material.

Figure 2:
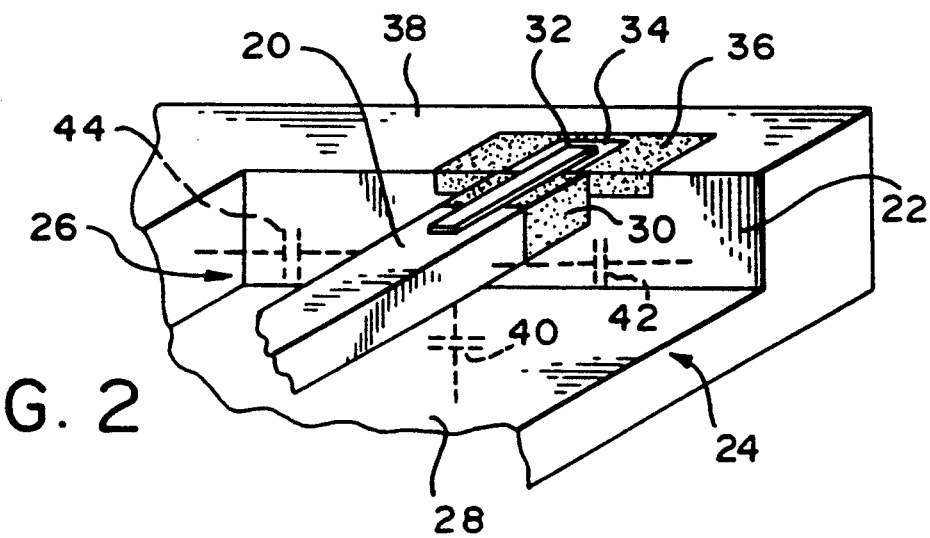
FIG. 2 is a perspective, partial diagrammatic view of an isolated, released submicron resistor.

A resistive element in accordance with the present invention is illustrated diagrammatically in FIG. 2, wherein resistive element 20 is fabricated in the form of a cantilever beam secured to an upstanding wall portion 22 of a substrate material generally indicated at 24. The upstanding wall portion 22 may be the side wall of a mesa formed on the top surface of a substrate wafer, or may be the wall of an aperture, such as that generally indicated at 26, which may be formed within a substrate wafer material. The present invention will be described herein in terms of the formation of cantilever beam elements within a cavity in the surface of a substrate, although it will be understood that the cantilever may be otherwise supported.

As illustrated, the cantilevered beam 20 extends over and is parallel to a floor portion 28 of the cavity 26. The beam preferably is not flexible, but is supported as required so that it is stiff and unmovable with respect to the substrate, as will be described below, to maintain it at a fixed distance above the floor 28. Since the beam 20 is formed of a conductive or semi-conductive material, it preferably is electrically insulated from the substrate 24 as by means of an insulating section 30 formed in the beam. A suitable connector 32 such as an aluminum conductor may be provided between the conductive portion of the beam and a connector pad 34 located on an insulating layer 36 formed on the top surface 38 of the substrate. This permits electrical connection between the beam 20 and electrical circuitry (not shown) which may be formed elsewhere on the substrate 24. Such circuitry, which may be a simple amplifier or a more complex circuit array, can be routinely fabricated on silicon wafers by well-known techniques and connected to resistor beam 20.

Any parasitic capacitance between the beam 20 and adjacent portions of the substrate 24 is illustrated by phantom capacitors 40, 42 and 44. Capacitance 40 is found between the lower surface of beam 20 and the floor 28 of recess 26, while capacitances 42 and 44 are found between side walls of the beam 20 and side walls of the recess 26. By virtue of the fact that the beam 20 is fully released from the substrate 24, and thus is spaced from all of the adjacent walls of the substrate, the parasitic capacitances 40, 42 and 44 are negligible. The present invention, by providing this minimal capacitance, enables the beam 20, and similarly configured structures to be described below, to be used as a resistive element in submicron electronic circuitry and to thereby improve the circuit parameters.

The resistive element may be formed as a cantilever, in the manner illustrated in FIG. 2, or may be constructed with other configurations as will be described, but in any of the herein-disclosed configurations, the significant reduction in parasitic capacitance caused by releasing the resistive element from the surrounding substrate provides significant advantages in the construction of various microcircuits and arrays.

As described in greater detail in co-pending application Ser. No. 07/906,873 of Susanne C. Arney, Noel C. MacDonald, and J. Jason Yao, filed on even date herewith, and assigned to the assignee of the present application, the disclosure of which is hereby incorporated herein by reference, beams such as the cantilever beam 20 may be fabricated to incorporate submicron active elements such as transistors either singly or in arrays. As disclosed in the aforesaid copending application, such transistors may be interconnected with other circuit elements formed on adjacent substrate surfaces or may be interconnected by means of suitable connector elements to form arrays of transistors suspended over a substrate floor, or both. Such transistor devices are illustrated in diagrammatic form in FIG. 3, to which reference is now made, and in accordance with the present invention, the interconnecting beams are constructed to form circuit elements such as resistors instead of merely forming conductive connectors or mechanical supports.

As illustrated in FIG. 3, cantilever beams such as beams 50, 51 and 52 are fabricated on a wall portion 54 of a substrate wafer material 56. As described above, the cantilever elements 50-52 extend generally horizontally over the floor portion 58 of the substrate, which floor may be fabricated in a cavity formed in the surface of the substrate 56, in one embodiment of the invention. The beams 50, 51 and 52 incorporate transistor structures generally indicated at 60, 61 and 62, respectively, which transistors may have any of the several structures and features described in detail in the aforesaid copending application, and may be fabricated following the procedures there described.

The transistors fabricated in accordance with the aforesaid co-pending application are interconnected, for example by beams such as those illustrated at 70, 71 and 72, which may be insulative mechanical supports for the transistors 60, 61 and 62 and/or may serve as interconnecting electrical conductors, again as set out in co-pending application D-1245. However, in accordance with the present invention, the beams 70, 71 and 72 are fabricated as resistive elements, such as the element 20 in FIG. 2, to electrically interconnect the transistors and to form a part of the electrical circuitry of those transistors or of a circuit array. The beams 70, 71 and 72 are doped during fabrication to provide the desired resistivity, and their cross sectional areas and lengths are selected in the design of the circuit or array to provide the desired resistance.

As indicated in Equation 1, the resistance of the resistor beams is proportional to the resistivity provided by doping, is proportional to the length of the beam, and is inversely proportional to its cross sectional area. Thus, for example, the cross section of the beam 72 can, for example, be 0.5 micrometer by 0.1 micrometer and can be of any length. Through proper doping of a substrate material such as silicon, the resistivity of the beam can easily be selected to be between 0.001 and 1.0 $\Omega$-cm and can be as high as 1,000 $\Omega$-cm. Accordingly, a beam 1 cm in length and having a resistivity of 1000 $\Omega$-cm can have a resistance of $10^{12}$ $\Omega$.

Figure 4:
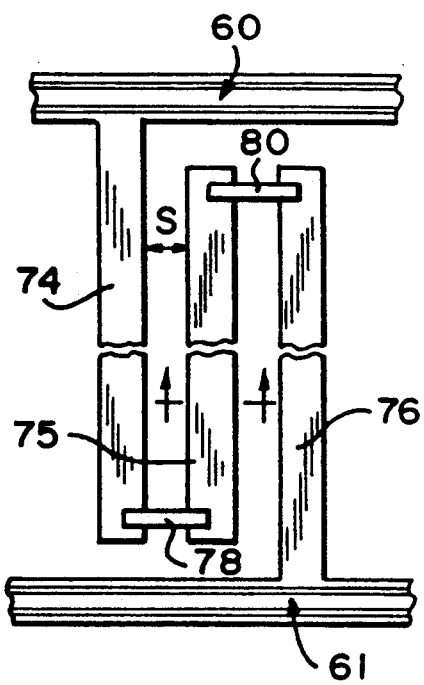
FIG. 4 is a top plan view of a plurality of interconnected resistor elements.
Figure 8A:
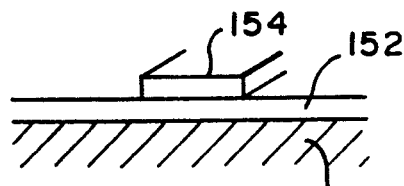
FIGS. 8A-8E are a diagrammatic illustration of the process of fabricating the resistor element of the invention.
Figure 8B:
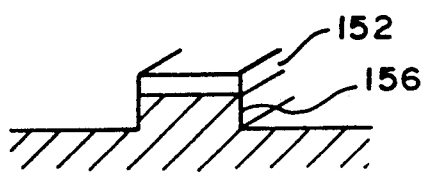

The resistive element can be a single beam such as that illustrated at 71 interconnecting transistors 60 and 61, or can be a plurality of beams in parallel, such as the beams 74, 75 and 76 illustrated in FIG. 4. In this illustration, beam 74 is connected to transistor 60, beam 76 is connected to transistor 61, and these two beams are spaced apart sufficiently far to enable fabrication of a third beam 75 parallel to and located between beams 74 and 76. Beam 75 is connected at its opposite ends by conductors 78 and 80 to form an elongated, generally sinusoidal resistor between transistors 60 and 61. The legs 74, 75 and 76 can be of any desired length, and their resistivity is controlled by doping during the fabrication of the device so that the total resistance between the two transistors can be carefully controlled. The resistance can be further controlled by connecting selected resistive legs in parallel, rather than in the series arrangement in FIG. 4, as by connecting the respective ends of each of the legs 74, 75 and 76 to corresponding transistors 60 and 61.

Instead of providing plural separate beams that must be interconnected by conductive elements in the manner illustrated in FIG. 4, the length of the resistor beam can be extended in the manner illustrated by beam 72 in FIG. 3, wherein the beam is a single, continuous, folded, generally sinusoidal beam extending between transistor 61 and transistor 62. In this case, the beam may consist of a plurality of parallel legs 84 through 88 connected at corresponding ends by cross arms 90 through 93. The terminal ends of the resistor are connected at 94 and 96 to transistors 61 and 62, respectively. The legs and cross connectors of beam 72 can be of any desired length, consistent with the space available within the integrated circuit or other microstructure being fabricated, and thus can have a wide range of resistance values. It will be understood that although the beam 72 is illustrated as having a squared-off sinusoidal configuration in top plan view, it will be understood that the shape can be widely varied; for example, the ends 90 to 93 can be curved if desired. By folding the length of the resistive element to produce the sinuous or zig zag shape of beam 72, an increase in circuit density can be attained while retaining the advantage of the present invention and reducing parasitic capacitance.

The folded resistor structures illustrated in FIGS. 3 and 4 are spaced from the bottom wall 58 of the substrate from which they are formed and from the side wall thereof in the manner discussed above with respect to the beam 20 of FIG. 2. The isolated, released structures of FIGS. 3 and 4 surround the resistor elements with air (or vacuum) to provide the required low dielectric constant in the region of the resistor. However, because the parallel legs of the resistive elements, such as the legs 85 and 86 in FIG. 3 and the legs 74, 75 in FIG. 4 are close to each other over a relatively long length, parasitic capacitive effects can occur. However, these effects are limited, since the potential between the adjacent legs is relatively low and because the opposed surfaces of the beams have relatively small areas. The distance S between adjacent legs can be adjusted in the design of the resistor to insure that any parasitic capacitance between such adjacent legs will be negligible.

FIG. 5 illustrates other possible variations of the resistor of the present invention, wherein parallel beams of selected resistivity may be interconnected in series, in parallel, or in series-parallel combinations to produce a desired resistance value, with the resistor elements being formed as an integral part of a submicron circuit. In the example of FIG. 5, which is a top plan view, a plurality of resistor beams 100, 101, 102 and 103 are fabricated on a substrate 106. In the illustrated example, the resistor beams are supported between spaced walls 108 and 110 of the substrate, which walls are fixed and which may serve as side walls for a recess, or cavity, 112 formed in the top surface of the substrate during the fabrication of the beams from the substrate material.

The beams 100-103 are fabricated in the manner of beam 20 in FIG. 2, may be of any desired length, and are spaced apart by a distance S sufficient to insure negligible capacitive resistance between adjacent resistive elements. The beams may have cross sectional dimensions of submicron scale, down to, for example, 0.1 micrometer by 0.1 micrometer, with the length between the side walls 108 and 110 being, for example, up to several centimeters. The beams may be interconnected with each other and with circuitry located elsewhere on the substrate in any selected pattern. For example, a contact 114 on the top surface of beam 110 may extend across an insulated region 116 at the end of the beam to contact a conductive pad 118, to which external circuitry may be connected by suitable wiring (not shown). The conductor 114, as illustrated, spans the distance S between adjacent resistive beams 100 and 101 to connect these two beams in parallel. A second conductive strip 120 is connected to the opposite ends of beams 100 and 101 and extends to an end portion of beam 102, thereby connecting the parallel arrangement of beams 100 and 101 in series to beam 102. The second end of beam 102 may be connected by means of conductor 122 to beam 103 which, in turn, is connected at its opposite end by way of conductor 124 to a conductive pad 126, to which electrical circuitry (not shown) may be connected. As illustrated, each of the beams 100, 101, 102 and 103 are connected at their opposite ends to the substrate by means of insulating portions to provide the necessary rigid support for these beams so that they do not sag downwardly into contact with the floor of the cavity 112, for any such sagging would increase the parasitic capacitance between the beams and the substrate.

Although the resistor beams of the present invention are fabricated so as to be relatively stiff, their very small cross section causes the beams to be somewhat flexible. Accordingly, it is often necessary to provide additional supports for them to prevent them from bending toward the substrate, particularly if they are to be exposed to environments where they are subjected to vibration or sudden movement. Such additional supports may be in the form of pedestals such as the pedestal 130 illustrated in FIG. 3 and extending between the resistive element 91 and the floor 58 of the substrate. Such pedestals preferably are fabricated from the silicon substrate material and oxidized for electrical insulation, although in some cases it may be desirable to leave them unoxidized or to incorporate transistors in the pedestals. Such pedestals may be provided at any desired location and are made of sufficiently small diameter as to have no significant effect on the capacitance between the supported resistor element and the base substrate.

In the preferred form of the invention, the stiffness of the resistor elements is enhanced by coating the exposed surfaces of the beam with a silicon nitride coating, with an oxide coating, or with a combination of the two, in the manner illustrated in FIG. 6, which is a cross sectional view of beam 71 taken along line 6—6 of FIG. 3. As there illustrated, the beam 71 is fabricated from the silicon material of the substrate 58 but is doped, as previously described, to produce the desired resistivity. Thereafter, a conforming coating of a dielectric insulating material such as a nitride layer 140 is deposited, as by low pressure chemical vapor deposition (LPCVD) or plasma-enhanced chemical vapor deposition (PECVD), on the side and top walls of the beam 71. Finally, a second insulating layer 142 of, for example, silicon dioxide, is deposited on the beam. These two layers do not affect the resistivity of the beam 71, and do not adversely affect the low capacitance between beam 71 and substrate 58. However, the layers 140 and 142 significantly stiffen the beam so that it does not sag down toward the base and so that it can act as a mechanical support for the transistors 60 and 61, in the illustrated example.

The resistor element 72 is similarly fabricated to include dielectric layers 140 and 142 to provide the required stiffness in the beam structure. The pedestal 130 supporting beam 72 is illustrated in cross section in FIG. 7. As indicated above, pedestal 130 is fabricated in the course of fabricating the beam 72, and thus is an integral part thereof, to provide the required support. As indicated above, this pedestal preferably is an oxide material to insulate the beam from the substrate.

Figure 8C:
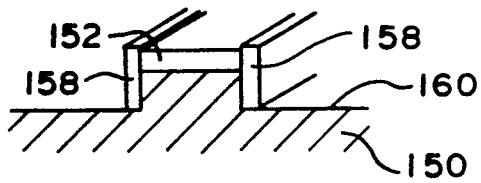
Figure 8D:
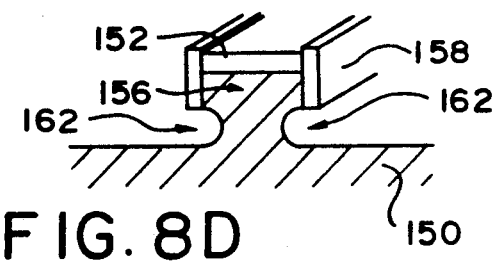

The method of fabricating the released, isolated beams which are utilized to form the resistive elements of the present invention is described in part, in co-pending U.S. application Ser. No. 07/868,138 of Noel C. MacDonald, et al, which application was filed on Apr. 14, 1992, is entitled "Integrated Scanning Probe", and is hereby incorporated herein by reference. This application, which is assigned to the assignee of the present application, describes methods for forming released beams as well as for forming opposed tips for such beams. Briefly, and as illustrated in FIGS. 8A-8E, such beams are formed by first patterning a substrate 150, which may be a single crystal silicon wafer or may be a silicon wafer with an epitaxial silicon-germanium top layer, or the like, with a dielectric layer 152 and a mask 154, the pattern defining an upstanding silicon island 156 formed during a trench etch, and having the shape of the desired resistive beam. The island is coated with a second dielectric layer 158 which includes silicon nitride, which layer is then etched on the horizontal surfaces to clear the top surface of the island and the bottom wall 160 of the trenches formed on opposite sides of the island, and to leave top and side wall nitride layers 152 and 158 (FIG. 8C).

Figure 8E:
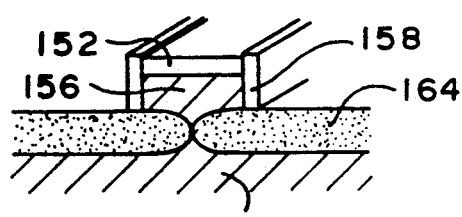

An isotropic recess etch of the surface 160 (FIG. 8D) produces recesses 162 in the sides of the island 156. These recesses encourage oxidation beneath the island during the following selective oxidation step. Selected parts of dielectric layer 152, 158 may be removed from the top of the island 156 to permit the island to be oxidized, as at region 30 of FIG. 2. Thereafter, the silicon of wafer 150, including the neck portion beneath island 156 is oxidized to form SiO$_2$ layer 164. The oxide undercuts island 156 to isolate it from the underlying substrate 150 (FIG. 8E). Removal of the oxide material 164 between the island and the substrate releases the island to form the beam of the invention. By leaving the oxide intact in selected locations, insulating support pedestals are provided, such as is illustrated at 130 in FIG. 7, to provide the desired mechanical support for the structure. The nitride layer 152, 158 on the top and side walls of beam 156 insulate the beam and stiffen it to provide bending strength.

The beam preferably is formed in a recess on the substrate, although it may also be formed from a mesa on the substrate, and selected portions of the beam may be oxidized or formed into cantilevered nitride segments to insulate segments of the beam from adjacent segments or from the substrate.

Figure 9:
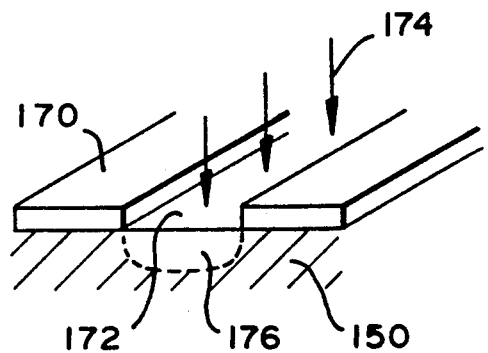
FIG. 9 is a diagrammatic illustration of the doping step used in fabrication of the resistor element of the invention.

During the course of fabricating the beam, and preferably after patterning to define the island from which the beam is formed, the silicon material which is to form the beam is doped, as by conventional ion implantation, to provide the desired resistivity for the beam. This may be accomplished, for example, by a suitable masking and doping process prior to the step of FIG. 8A, wherein, as indicated in FIG. 9, the surface of the wafer 150 is masked at 170, leaving the region 172 exposed. This region coincides with the location on the wafer where the island 156 is to be formed, and its top surface is ion implanted as indicated by arrows 174, to dope the substrate at 176 to provide the desired resistivity.

Figure 10:
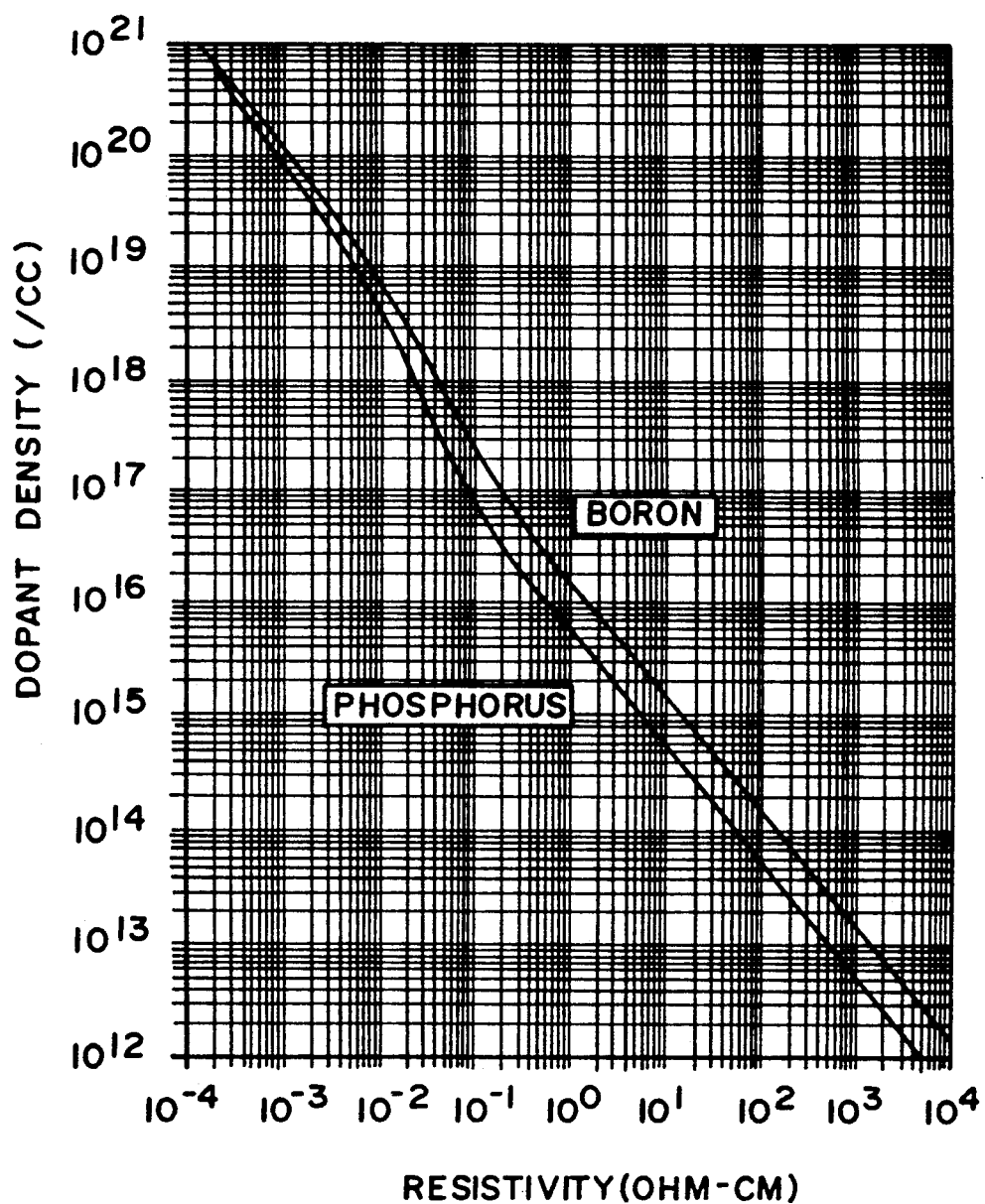
FIG. 10 is a diagrammatic illustration of the relationship between dopant density and resistivity.

As illustrated in FIG. 10, the resistivity of the substrate material is varied with the dopant density. The use of dopant at a density of between $10^{15}$ and $10^{19}$ is preferred, for that density is most easily attained, and provides resistivities between about $10^{-2}$ and 10 $\Omega$-cm. This doped region 176 is then used to form beam 156, as discussed above, with the etching and oxidation steps isolating the doped beam material. The formation of the transistors 60, 61, and 62 as described in co-pending application Ser. No. 07/906,873 utilizes the same general techniques that are described in Ser. No. 07/868,138.

Figure 11:
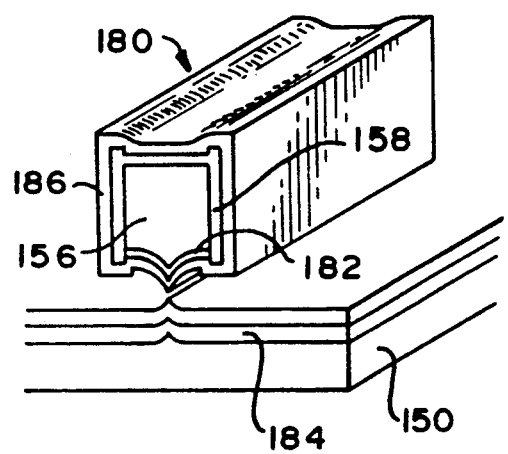
FIG. 11 is a perspective, diagrammatic view of a shielded resistor element.

FIG. 11 illustrates a modification of the resistor element, wherein a shield is provided around the resistor to further reduce its parasitic capacitance. The shielded resistor element 180 is a single crystal silicon beam such as beam 156, fabricated in the manner described above with respect to FIGS. 8 and 9. After release of the beam, as by removal of the oxide 164 in the process of FIG. 8E, a shield is formed around the beam by first oxidizing the beam to produce a layer 182 of SiO$_2$ on the bottom surface of beam 156 and a layer 184 of SiO$_2$ on the top surface of substrate 150. The layer 182 cooperates with the nitride layer 152, 158, which may be Si$_3$N$_4$, to produce an electrically insulating layer around the periphery of beam 156.

A doped polysilicon layer 186 is next deposited on the outer surface of the insulating layer 158, 182, as illustrated in FIG. 11, the layer 186 surrounding the insulating and fully enclosing the beam 156. The doped polysilicon is a resistive material which may be grounded at one end or otherwise connected to provide a shield which effectively eliminates parasitic capacitance between resistor element 156 and adjacent structures.

Figure 12:
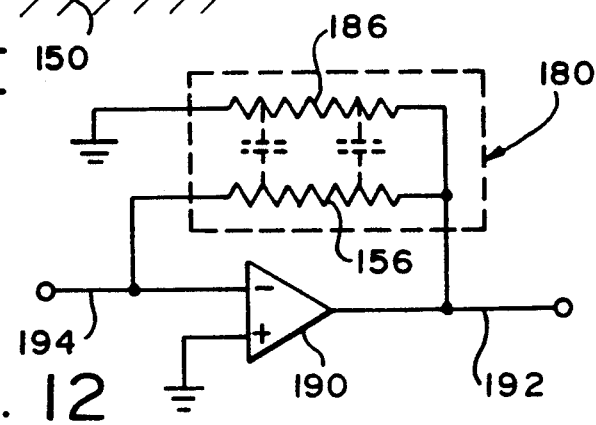
FIG. 12 is a schematic of an electrical circuit utilizing the resistance of the present invention.

FIG. 12 illustrates the manner in which the shielded resistor element 180 can be connected in a circuit an operational amplifier 190 to reduce parasitic resistance. The amplifier may be an integrated circuit fabricated on substrate 150, with resistor 156 connected as a feedback resistor (for example) by suitable conductors between the output 192 and the input 194 of amplifier 190, utilizing the conductors described above. In this configuration, the input is at virtual ground, while the shielding resistance 186 is connected between the outlet 192 and ground. Since resistance 186 surrounds the resistor 156, and since corresponding ends of both resistors are at essentially the same potentials, there is essentially no potential between any corresponding points along the two resistors, and any parasitic capacitance associated with the resistor 156 is negligible.

Although the present invention has been described in terms of preferred embodiments thereof, it will be understood that variations and modifications may be made without departing from the true spirit and scope thereof as set forth in the following claims.

What is claimed is:

1. A submicron resistor element for integrated circuit structures, comprising:
    a single crystal silicon substrate;
    a doped, electrically isolated, released single crystal silicon resistive beam secured to said substrate, said released beam being surrounded by air and spaced sufficiently far from said substrate to substantially eliminate parasitic capacitance between the beam and the adjacent substrate.

2. The resistor of claim 1, wherein said released beam has a submicron cross-sectional area.

3. The resistor of claim wherein said released beam includes a dielectric coating which stiffens the beam against vibrational and bending motion.

4. The resistor of claim 1, wherein said released beam is folded to provide an extended beam length within the boundaries of said substrate.

5. The resistor of claim 4, wherein said released beam has cross-sectional dimension of about 0.1 micron by 0.1 micron.

6. The resistor of claim 1 wherein said resistor element further includes means supporting said released beam above said substrate.

7. The resistor of claim 6, wherein said means supporting said released beam comprises pedestal means extending between said beam and said substrate.

8. The resistor of claim 7, wherein said pedestal means is integral with said beam and substrate.

9. The resistor of claim 8, wherein said pedestal is an oxide material.

10. The resistor of claim 6, wherein said means supporting said released beam comprises cantilever means securing one end thereof.

11. The resistor of claim 1, wherein said substrate includes cavity means in an upper surface thereof, said cavity including side walls and a bottom wall, and wherein said resistive beam is located within said cavity.

12. The resistor of claim 11, wherein said resistor comprises an elongated beam having a submicron cross-sectional area.

13. The resistor of claim 12, wherein said resistor comprises a plurality of parallel elongated beams each having a submicron cross-sectional area, and conductor means electrically connected to said beams.

14. The resistor of claim 12, further including connector means electrically connected to said resistor for connecting said resistor to active electrical circuit components.

15. The resistor of claim 1, further including shield means surrounding said resistive beam.

16. The resistor of claim 15, wherein said shield means comprises an electrically insulative coating on said beam and a resistive coating surrounding said insulative coating.

17. A method of fabricating submicron resistive elements, comprising:
defining in a single-crystal substrate a region having a selected length, width, and shape;
doping said region to produce in said single-crystal material a selected resistivity;
etching said substrate to produce trenches defining an upstanding island incorporating said doped region;
recess etching said substrate around said island;
oxidizing said substrate to produce an oxide undercut of said island to thereby isolate said island from said substrate; and
selectively removing said oxide to release said island to form a resistive beam.

18. The method of claim 17, further including further oxidizing said resistive beam to provide an insulative layer and thereafter covering said insulative layer with a resistive layer.

* * * * *

UNITED STATES PATENT AND TRADEMARK OFFICE
CERTIFICATE OF CORRECTION

PATENT NO. : 5,287,082

DATED : February 15, 1994

INVENTOR(S) : ARNEY et al.

It is certified that error appears in the above-identified patent and that said Letters Patent is hereby corrected as shown below:

Column 11, line 7, after the word "claim" add --1,--.

Signed and Sealed this

Twenty-first Day of June, 1994

*Attest:*

BRUCE LEHMAN

*Attesting Officer*     Commissioner of Patents and Trademarks